(12) United States Patent
Di Franco et al.

(10) Patent No.: US 7,521,758 B2
(45) Date of Patent: Apr. 21, 2009

(54) DMOS DEVICE OF SMALL DIMENSIONS AND MANUFACTURING PROCESS THEREOF

(75) Inventors: Antonio Di Franco, Osnago (IT); Emanuele Brenna, Lecco (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 90 days.

(21) Appl. No.: 11/716,078

(22) Filed: Mar. 8, 2007

(65) Prior Publication Data

US 2007/0249124 A1    Oct. 25, 2007

Related U.S. Application Data

(62) Division of application No. 10/758,699, filed on Jan. 14, 2004, now Pat. No. 7,205,597.

(30) Foreign Application Priority Data

Jan. 14, 2003    (IT)    ............ TO2003A0013

(51) Int. Cl.
*H01L 27/01*    (2006.01)

(52) U.S. Cl. .............. 257/336; 257/335; 257/337
(58) Field of Classification Search ........ 257/335, 257/336, 337
See application file for complete search history.

(56) References Cited

U.S. PATENT DOCUMENTS 5,171,705 A * 12/1992 Choy .................... 438/273
7,205,597 B2 * 4/2007 Di Franco et al. .......... 257/296

* cited by examiner

*Primary Examiner*—Long Pham
(74) *Attorney, Agent, or Firm*—Lisa K. Jorgensen; Paul F. Rusyn; Graybeal Jackson LLP

(57) ABSTRACT

In a body of semiconductor material, a field region separates a first active area and a second active area. A drain region is formed in the first active area; a body region is formed in the second active area and accommodates a source region. A body-contact region is formed inside the source region and extends from the surface as far as the body region. An insulating layer extends on top of the surface and accommodates a plurality of metal contacts, which extend as far as the drain region, the source region and the body-contact region. The body-contact region is self-aligned to a respective contact.

20 Claims, 13 Drawing Sheets

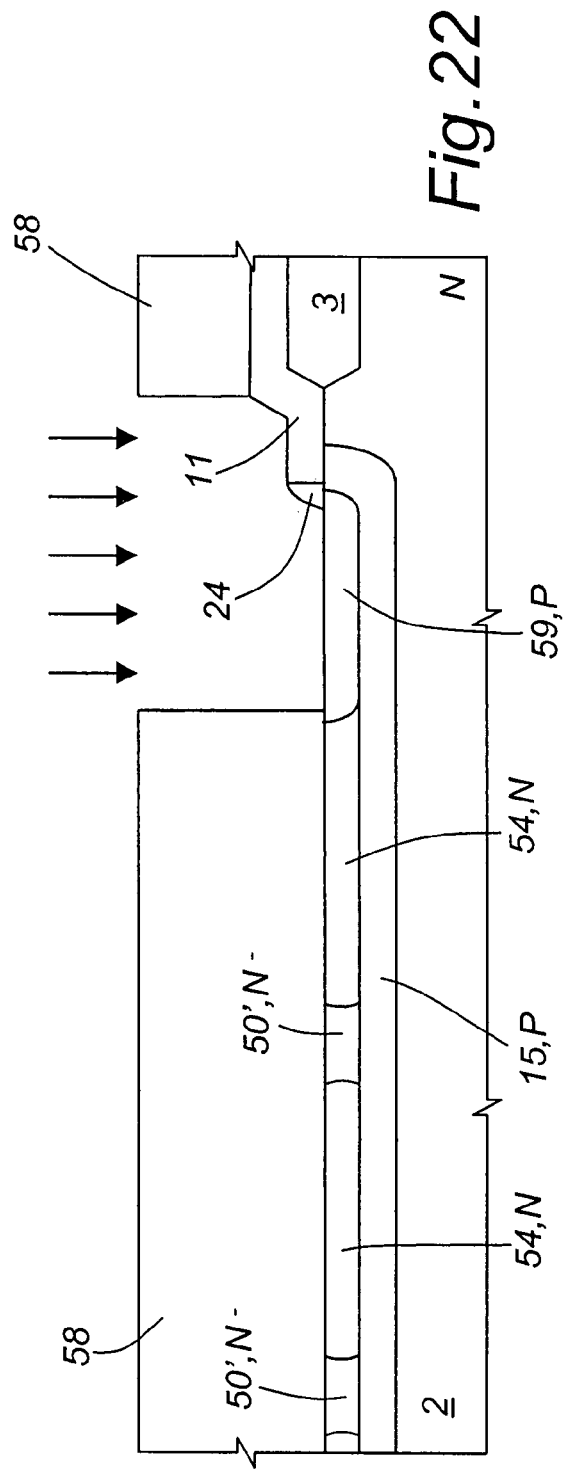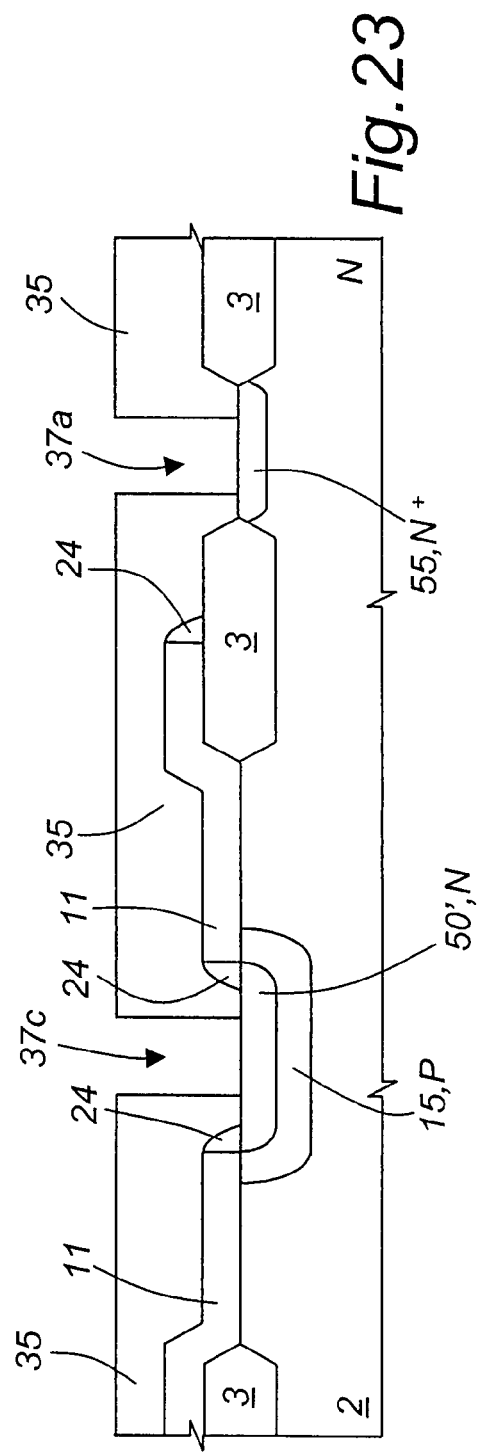

DMOS DEVICE OF SMALL DIMENSIONS AND MANUFACTURING PROCESS THEREOF

PRIORITY CLAIM

This application is a divisional application of U.S. application Ser. No. 10/758,699, filed Jan. 14, 2004, now U.S. Pat. No. 7,205,597 which claims priority from Italian patent application No. TO2003A000013, filed Jan. 14, 2003, which are incorporated herein by reference.

TECHNICAL FIELD

Embodiments of the present invention relate to a DMOS device of small dimensions and the manufacturing process thereof. In particular, embodiments of the invention relate to a DMOS transistor in BCD (Bipolar CMOS and DMOS) technology capable of operating at voltages higher than 16 V.

BACKGROUND

As is known, BCD power technology enables integration of structures of different types in a same chip. This technology has enjoyed wide application thanks to integration of circuitry transistors defining an intelligent part with power components.

Consequently, in view of the continuous requirements of miniaturization, it is desirable to modify the present process flow, so as to reduce the dimensions of the devices, and specifically of the DMOS transistors.

In particular, it is desirable to reduce the size between the source contact and the gate region of the DMOS transistor, without causing at the same time any critical factors in the performance of the device or of the fabrication process.

On the other hand, a mere reduction of the dimensions and distances between the various parts without modifying the layout of the device would entail the risk of errors in the positioning of the various regions or superposition thereof on account of the tolerances of fabrication, and hence of malfunctioning of the device.

The aim of the present invention is to solve the problems referred to above.

SUMMARY

According to an embodiment of the present invention, a DMOS device and the corresponding manufacturing process are provided, as defined in claims 1 and 6, respectively.

In practice, according to one embodiment of the invention, the enriched contact regions, necessary for contacting the body region formed in the source active area, are formed after opening the contacts, in a self-aligned manner to the contacts themselves (self-aligned body contact implant). In this way, the body contact implant is performed only where it is necessary to obtain contact with the body region; consequently, there is a gain in tolerance, and it is possible to reduce the distance between the body contact and the gate region and hence the size of the source active area, without giving rise to any critical factors.

BRIEF DESCRIPTION OF THE DRAWINGS

For a better understanding of the invention, embodiments thereof are now described, purely by way of non-limiting example, with reference to the attached drawings, wherein:

FIG. 22 illustrates a cross-section taken along the section plane XXII-XXII of FIG. 21;

FIG. 23 illustrates a cross-section similar to that of FIG. 19, taken in a subsequent fabrication step according to one embodiment of the present invention;

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Initially, a known process will be described, in order to highlight the critical aspects thereof and enable detection of the differences with respect to the described embodiments of the present invention.

Figure 1:
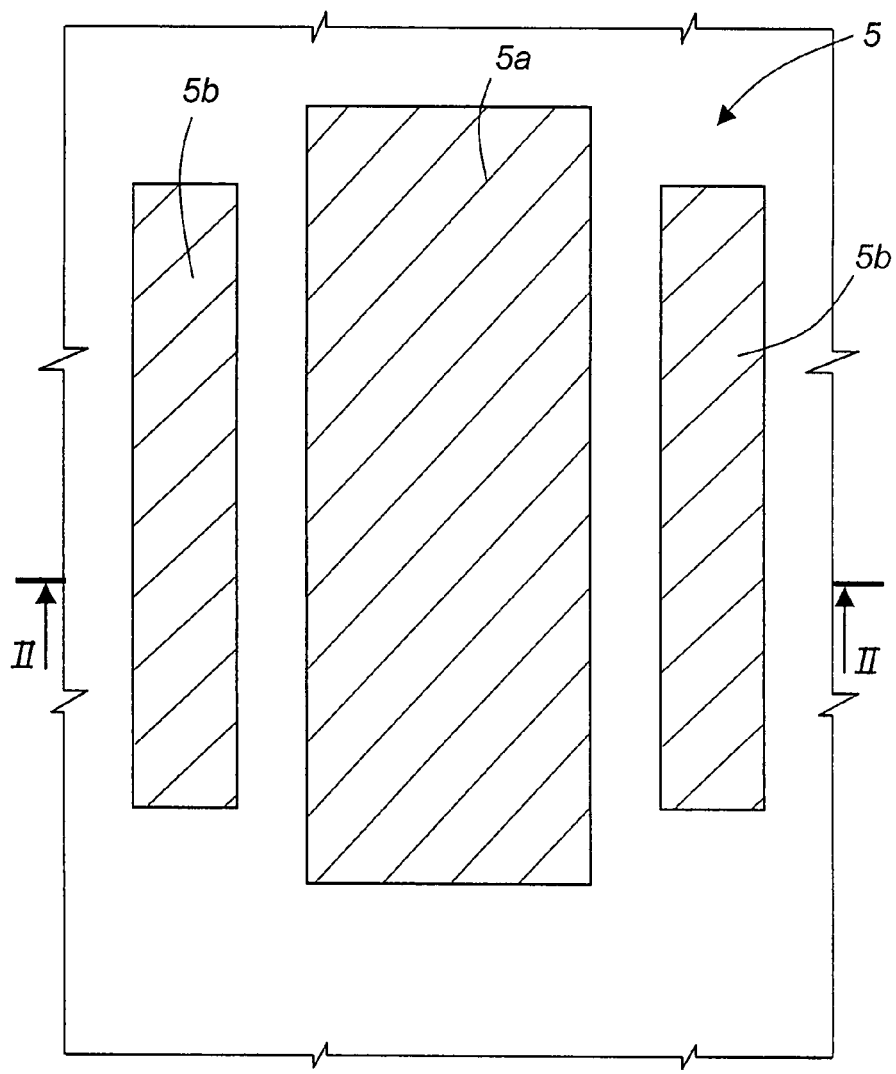
FIG. 1 illustrates a mask used in a first fabrication step of a known DMOS device.
Figure 2:
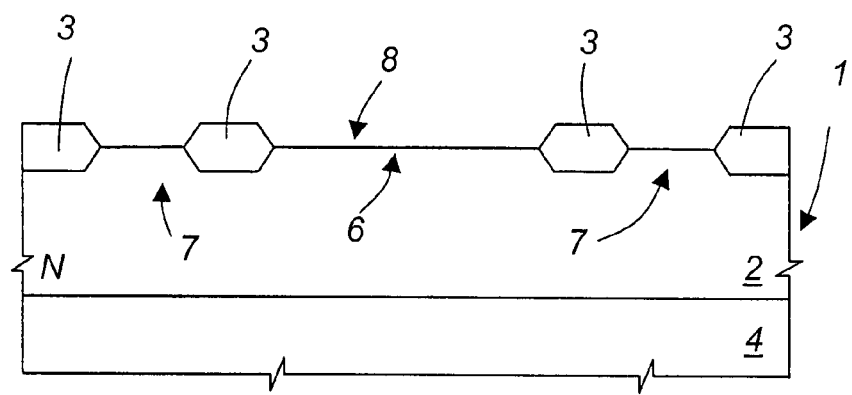
FIG. 2 illustrates a cross-section through a portion of a wafer, taken along section line II-II of FIG. 1, after the step using the mask of FIG. 1.

As illustrated in FIGS. 1 and 2, initially, in a wafer 1 of semiconductor material, comprising a standard-doping substrate 4, accommodating at least one well 2, here of N type, and a surface 8, an active-area mask 5 is formed, that has the aim of protecting the areas of the substrate intended to accommodate the conductive regions forming the devices to be integrated (here a DMOS transistor). In the example, in which the DMOS device must withstand voltages higher than 16 V, the drain and source regions of the DMOS transistor must be formed in separate active areas; consequently, the active-area mask 5 has a central region 5a of larger size, defining a source active area, and two lateral regions 5b of smaller size, formed on the two sides of the central region 5a, defining the drain active areas. In FIG. 1, as in the subsequent figures, the areas coated with the mask are hatched.

The process for defining the active areas is standard and hence not illustrated in detail herein. At the end of the process, as may be seen in FIG. 2, a field-oxide region 3 extends on the surface (and in part inside) the wafer 1, delimiting on all the sides a source active area 6 and two drain active areas 7. As may be noted in particular in FIG. 1, the source active area 6 and drain active areas 7 have a rectangular shape, and the two drain active areas 7 each extend alongside a respective side of the source active area 6.

Figure 3:
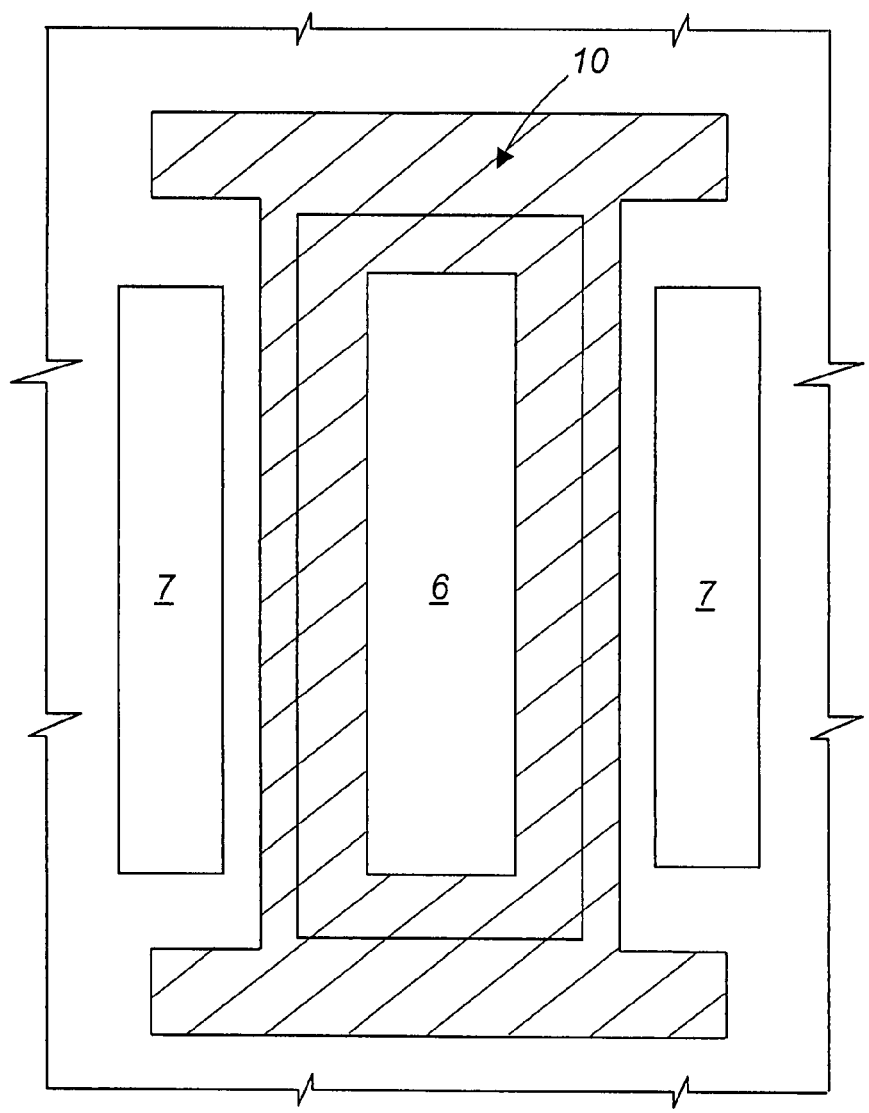
FIGS. 3 and 4 illustrate a mask used in a fabrication step subsequent to the step of FIG. 1 and the cross-section thereof, taken in a plane similar to that of FIG. 2.
Figure 4:
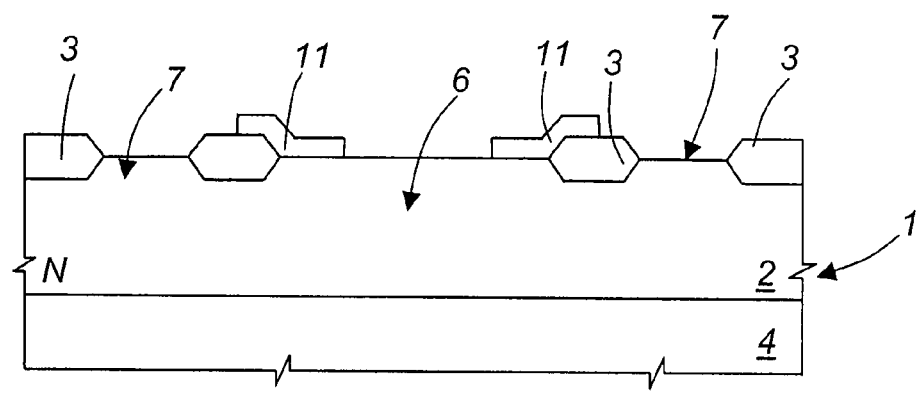

In a way not illustrated herein, a gate-oxide layer is deposited. Then a polysilicon layer is deposited and defined using a poly mask 10, as illustrated in FIGS. 3 and 4. After removing the exposed portions, a gate region 11 is formed, which has the same shape as the poly mask 10 of FIG. 3 and thus extends along the perimeter of the source area 6 and in part on top of the field oxide 3, and therefore substantially along the perimeter of a rectangle.

Figure 5:
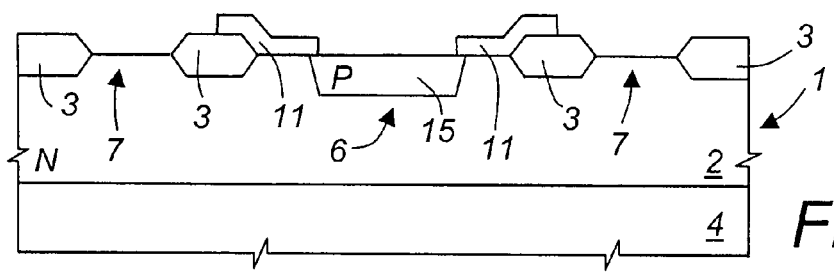
FIG. 5 illustrates a cross-section obtained in a subsequent fabrication step.

Next, a body mask, not illustrated, is deposited and has an opening substantially matching with the source active area 6, and, using this mask, a body region 12, of P type, is implanted. At the end of the implantation, the structure of FIG. 5 is obtained, in which the body region is designated by 15.

Figure 6:
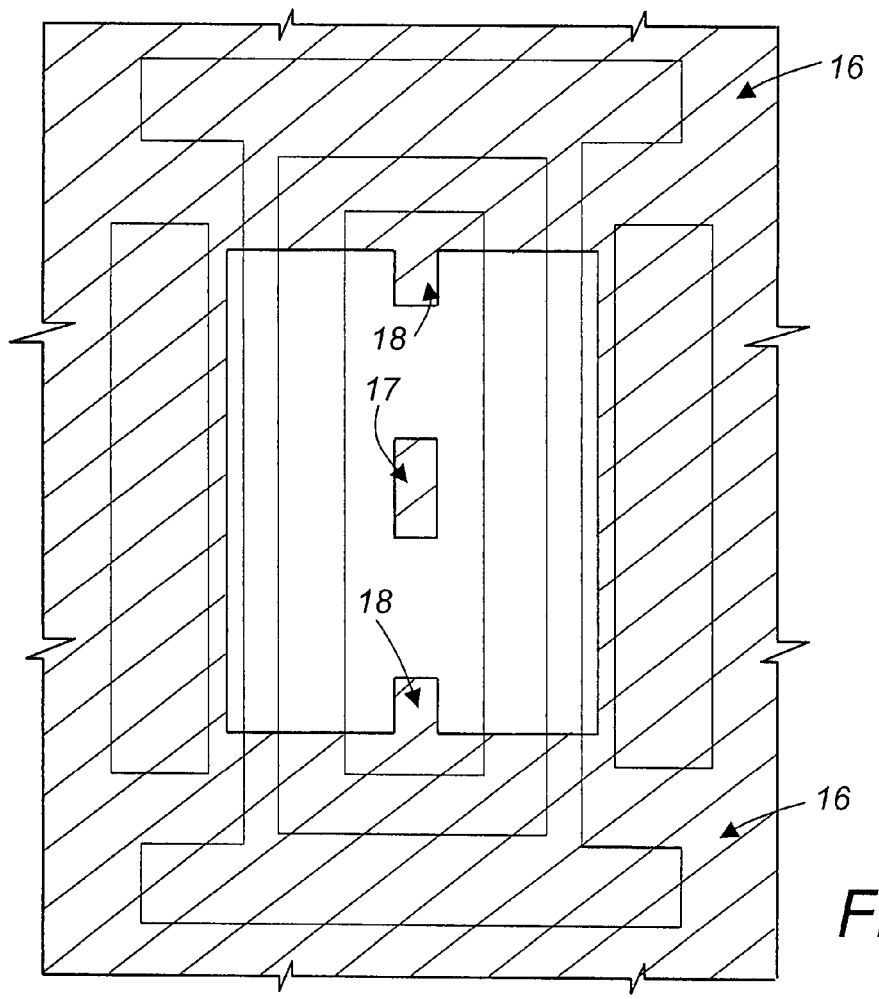
FIGS. 6 and 7 illustrate a mask used in a fabrication step subsequent to the step of FIG. 5 and the cross-section thereof.
Figure 7:
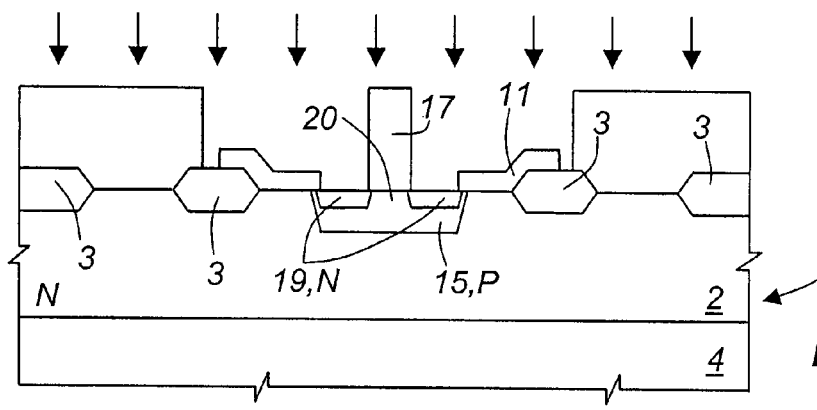

Subsequently (FIG. 6), after oxidation (not described in detail herein), a low-doped drain (LDD) mask 16 is deposited which exposes the body region 15 except for one or more isolation islands 17 and two longitudinal end areas 18, which should accommodate body contacts. Using the LDD mask 16, an LDD implant is performed, here of N type, so that an LDD region 19 is formed inside the body region 15 and surrounds one or more non-implanted central portions 20, where the body region 15 emerges at the surface 8 of the wafer 1.

Figure 8:
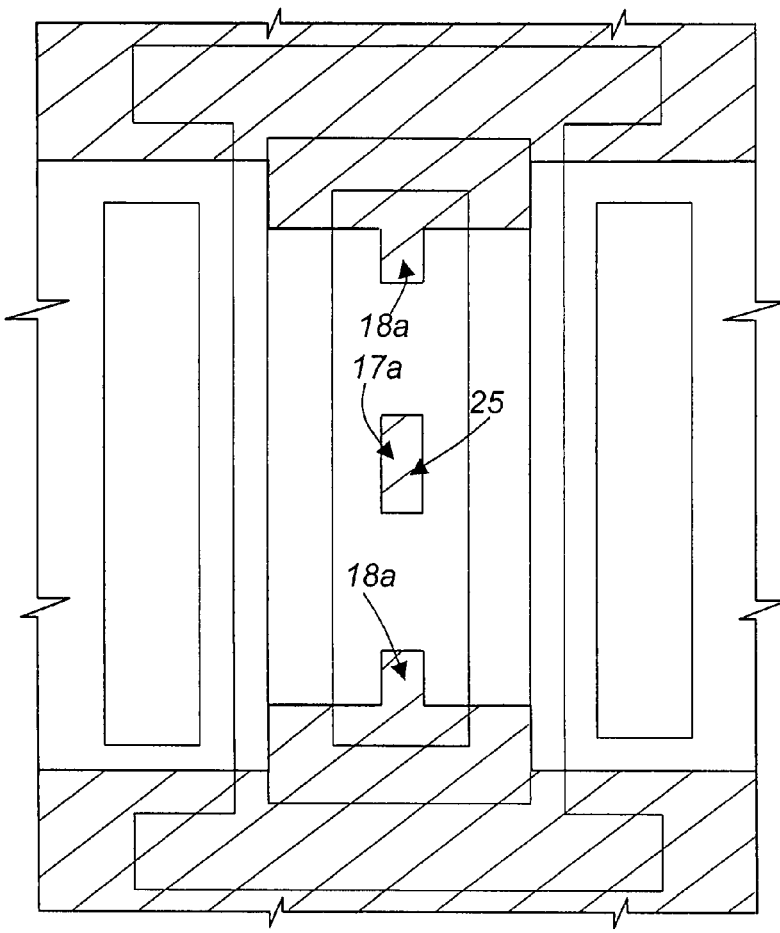
FIGS. 8 and 9 illustrate a mask used in a fabrication step subsequent to the step of FIG. 6 and the cross-section thereof.
Figure 9:
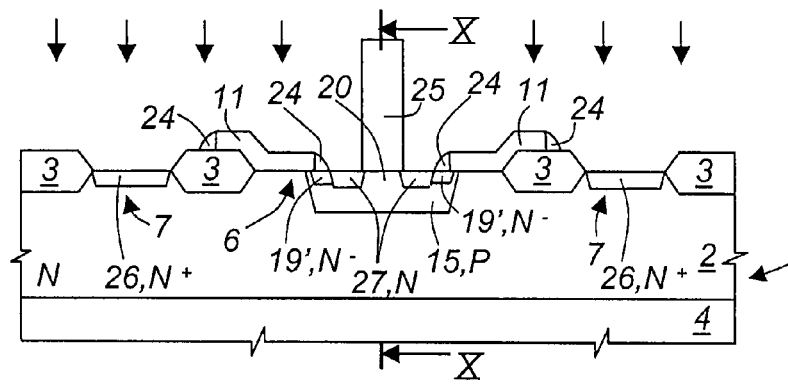
Figure 10:
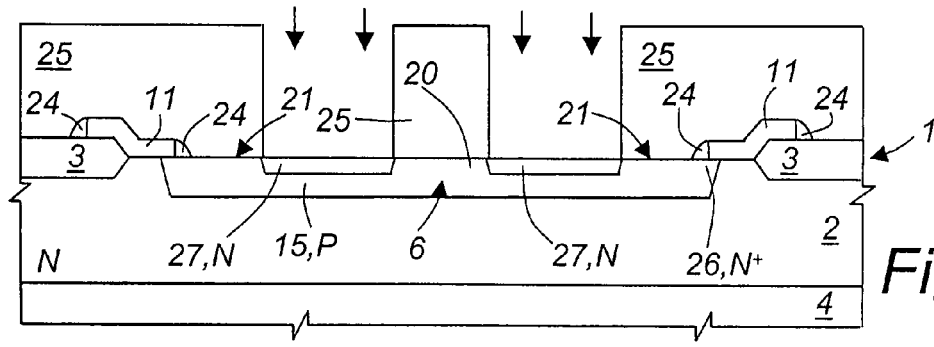
FIG. 10 illustrates a longitudinal cross-section of a portion of the wafer, taken along section line X-X of FIG. 9.

Next, FIGS. 8-10, in a per se known manner, spacers 24 are formed at the sides of the gate region 11 (FIG. 9), and an S/D mask 25 is deposited which, inside the source active area 6, has a shape similar to that of the LDD mask 16, with islands 17a and longitudinal end areas 18a. Subsequently, using the S/D mask 25, dopant species of N type are implanted, which, in the drain active areas 7, form drain regions 26 of N+ type, and, in the source active area 6, form a rectangular source region 27, narrower than the LDD region 19 because of the spacers 24. Consequently, the source region 27 is surrounded on the two long sides by a peripheral LDD portion 19 and surrounds the non-implanted central portion or portions 20, where the body region 15 extends up to the wafer surface. Then the structure of FIGS. 9 and 10 is obtained, which illustrate two perpendicular cross-sections showing a non-implanted central portion 20 and the two end regions 21, where the body region 15 extends up to the surface of the wafer 1.

Figure 11:
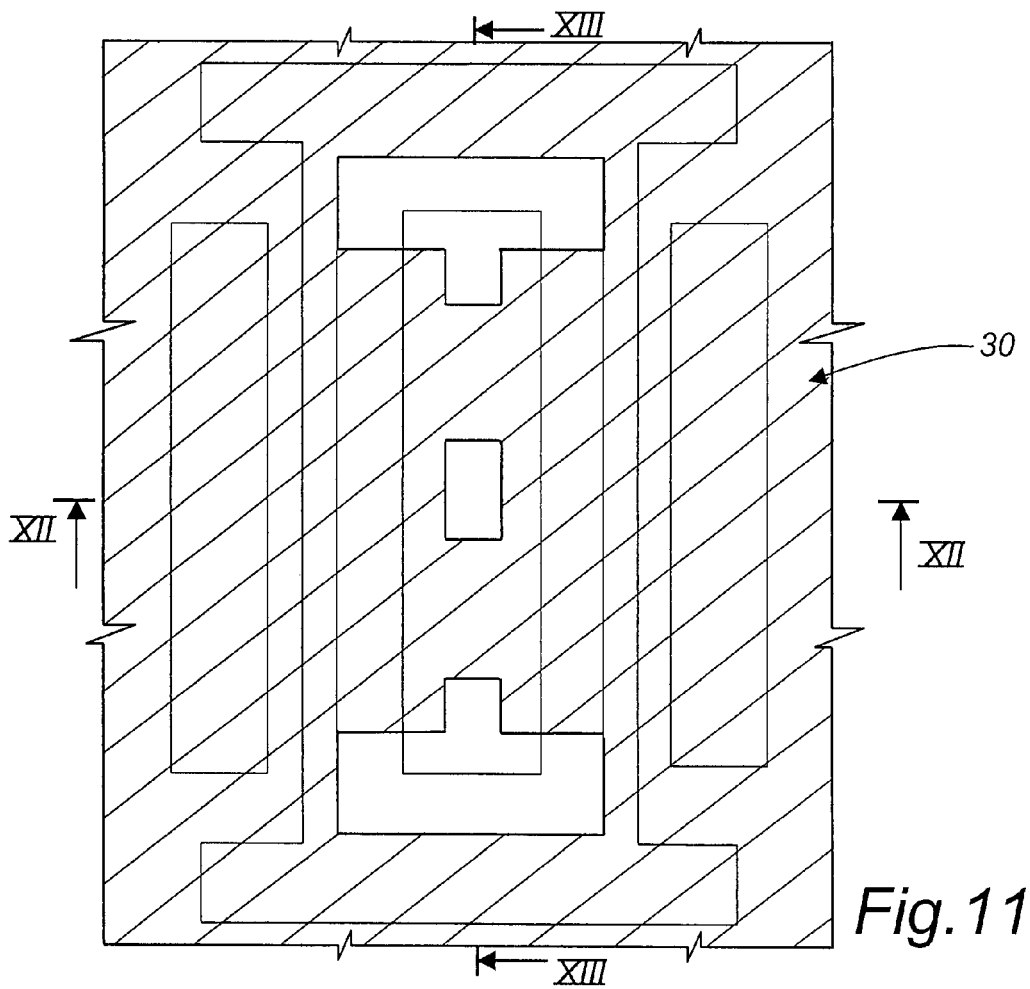
FIGS. 11-13 illustrate a mask used in a fabrication step subsequent to the step of FIG. 8 and the cross-section thereof.
Figure 12:
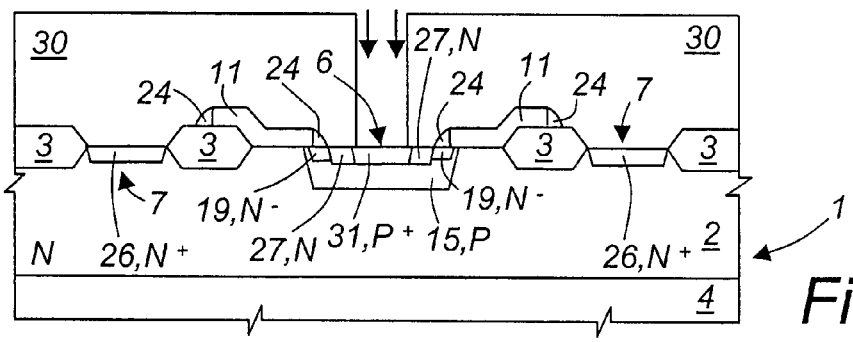
Figure 13:
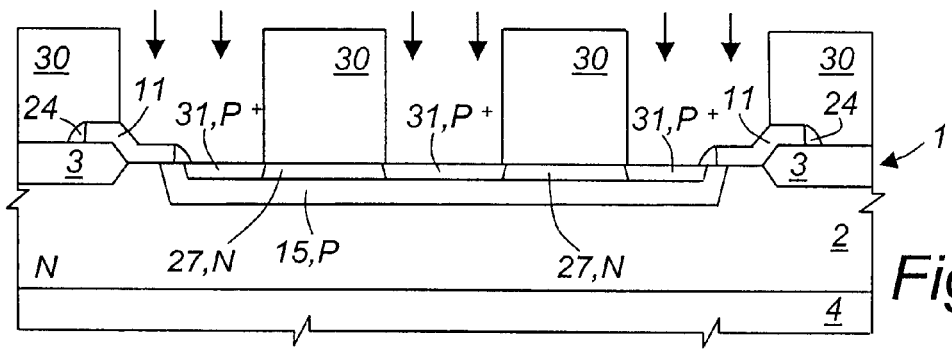

Next (FIGS. 11-13), a body-contact mask 30 is formed and covers completely the drain active areas 7 and a fair part of the source active area 6, except for portions where contact regions for the body region 15 are to be formed. For this purpose, on top of the source active area 6, the body-contact mask 30 has a substantially complementary shape to the S/D mask 25, except for tolerances. Where previously the non-implanted central portion 20 and the end regions 21 were present, now body-contact regions 31, of P+ type, are formed.

Figure 14:
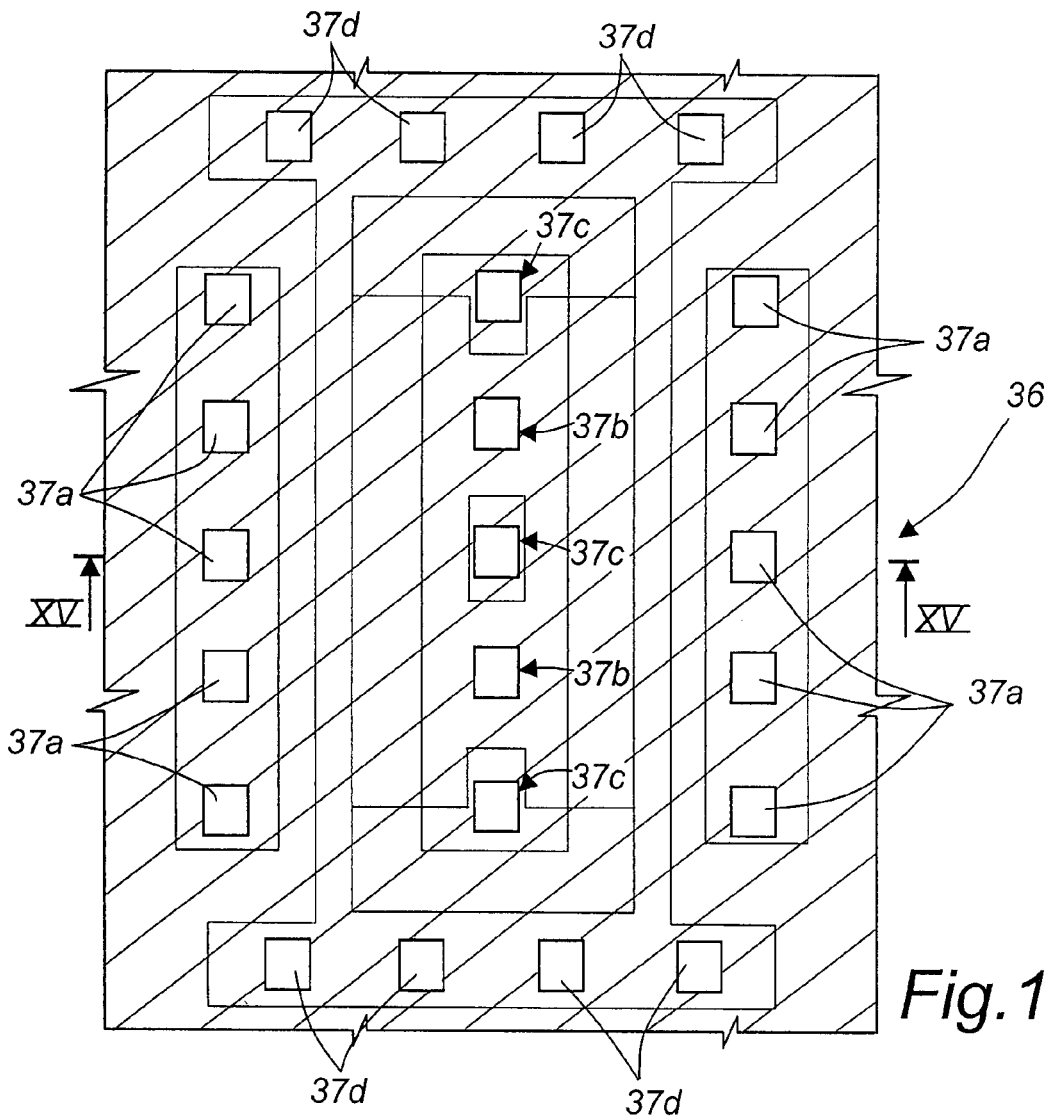
FIGS. 14 and 15 illustrate a mask used in a final fabrication step and the cross-section of a known DMOS device.

Next, the wafer 1 is coated with an insulating layer 35 (FIG. 15), and the contacts are opened, using a contact mask 36 (FIG. 14). In particular, in the insulating layer 35 there are formed: openings 37a, which reach the drain regions 26 in the drain active areas 7; openings 37b, 37c, which reach the source region 27 and the contact regions 31 in the source active area 6; and openings 37d, which reach the gate regions 11 (FIG. 14). The openings 37a-37c are then filled with metal material so as to form contacts 38, in a per se known manner.

Figure 15:
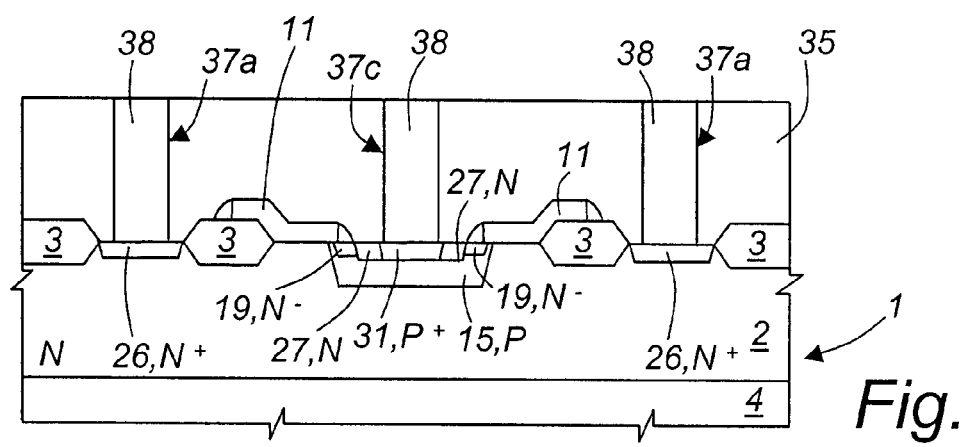
Figure 16:
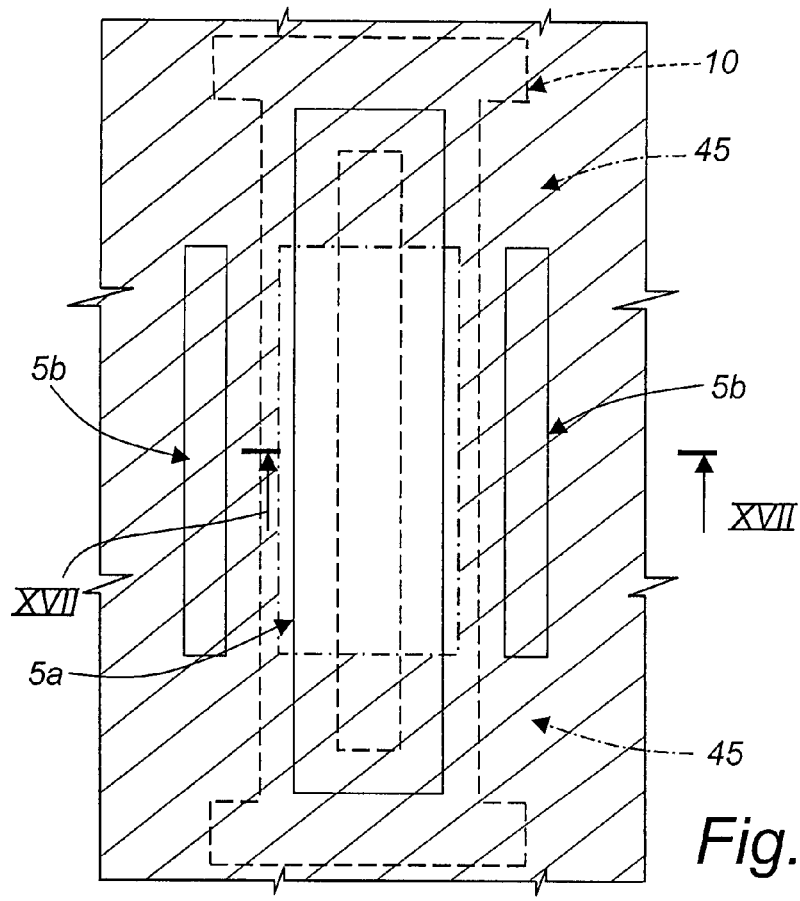
FIG. 16 illustrates masks used according to a first embodiment of the invention.
Figure 17:
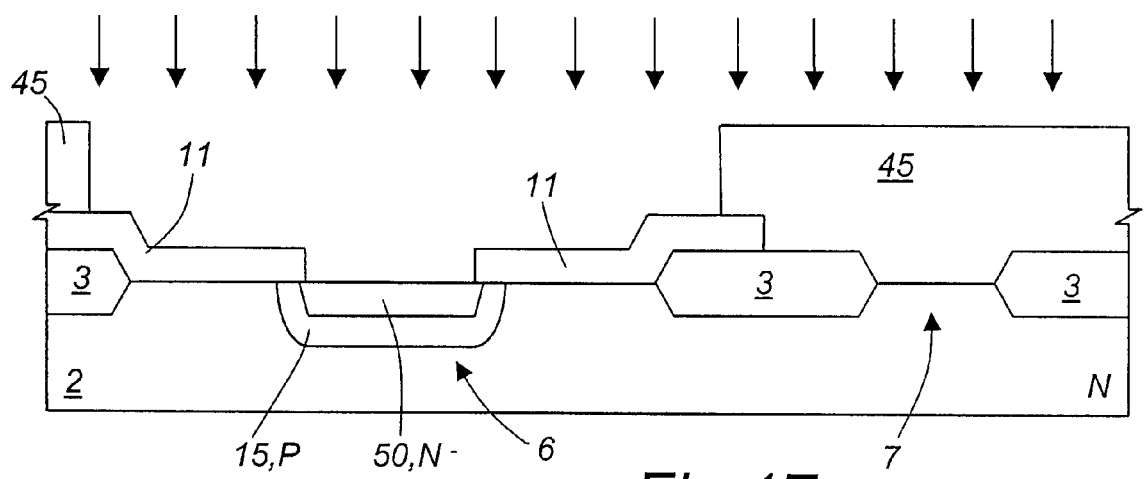
FIG. 17 illustrates a cross-section taken along section line XVII-XVII of FIG. 16.
Figure 18:
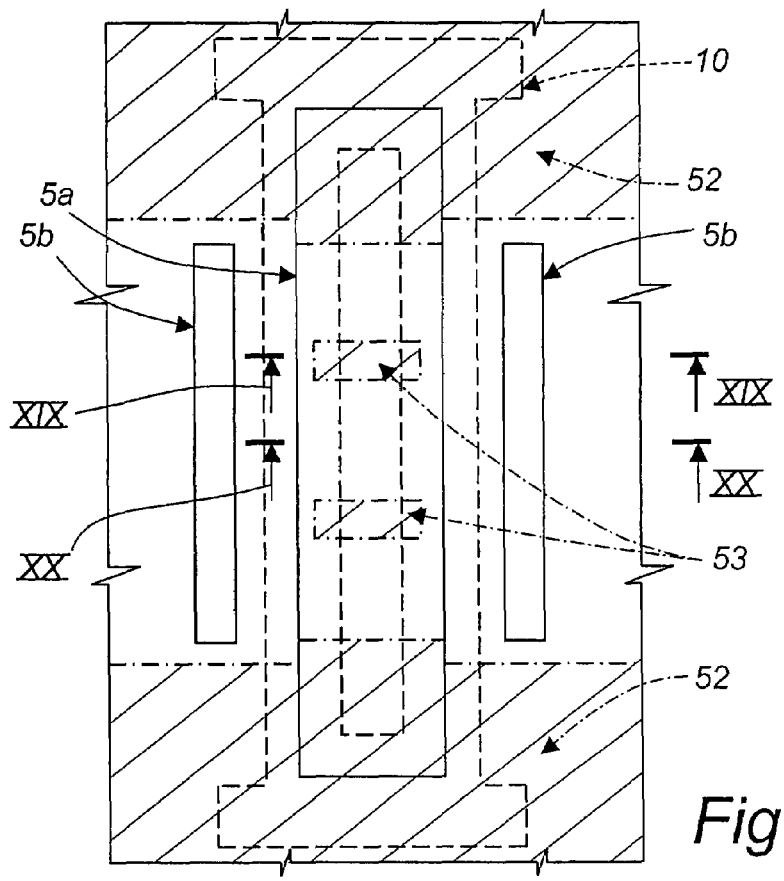
FIG. 18 illustrates a mask used in a subsequent fabrication step according to one embodiment of the present invention.

If the aim is to reduce the dimensions of the DMOS transistor of FIG. 15, and leave the proportions unaltered, it is possible to act on the dimensions of the contacts 37, on the width of the drain active areas 7, and on the distance between the contacts 38 and the gate region 11.

As may be noted in particular from the cross-section of FIG. 15, the latter parameter (contacts/gate distance) is somewhat critical. In fact, a possible misalignment and/or a dimensional variation of the S/D mask 25 could prevent the source region 27 from being made in a correct way in the area comprised between the body-contact region 31 and the gate region, since, when the S/D mask 25 is made, the spacers 24 are already present. In particular (see FIG. 9), a misalignment of the S/D mask 25, for example its displacement to the right, in the case of reduction of the distance referred to above, would entail the risk of not performing a proper implantation of the portion of the source region 27 formed to the right of the contact 38. This is all the more serious in consideration of the fact that the area not implanted with N-type species will certainly be P+-implanted, since the body-contact mask 30 (FIG. 12) has an opening wider than the island 25, with the risk of pinch-off of the DMOS transistor in this area.

To solve the above problem, according to one embodiment of the invention, it is proposed to implant the body contacts after opening the contacts. In this way the P+ implant is performed only where it is necessary, enabling a gain in tolerance and hence a reduction of the contact/body distance. In particular, it is possible to reduce the dimensions of the source active area, without involving critical aspects.

Hereinafter, the differences in the process flow will be described in detail, as compared to the known process described above, according to two embodiments of the invention. Consequently, in FIGS. 16-29, the masks and the regions, which are not modified substantially with respect to the known device, are designated by the same reference numbers.

The process starts with the steps described with reference to FIGS. 1-4, including defining the active areas 6, 7, depositing the gate oxide, forming the gate regions 11, and forming the body region 15. Next, using an LDD mask 45 illustrated in FIG. 16, the LDD implant is performed, here of N type. In practice, as regards most of the source active area 6, the implant is blanket type, i.e., not shielded. The implant then forms, in the source active area 6, a well-shaped LDD source region 50, which extends almost throughout the length of the source active area 6, except for longitudinal end portions, as illustrated in cross-section in FIG. 17.

Figure 19:
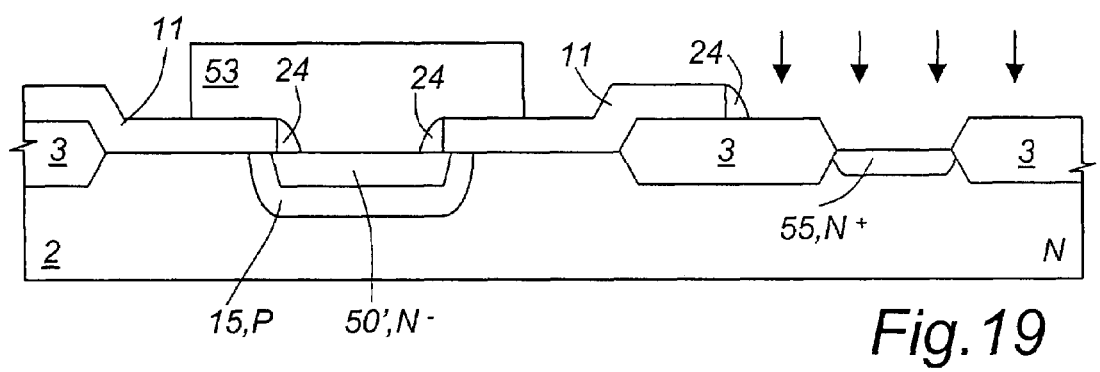
FIGS. 19 and 20 illustrate two cross-sections taken along the section planes XIX-XIX and XX-XX of FIG. 18.
Figure 20:
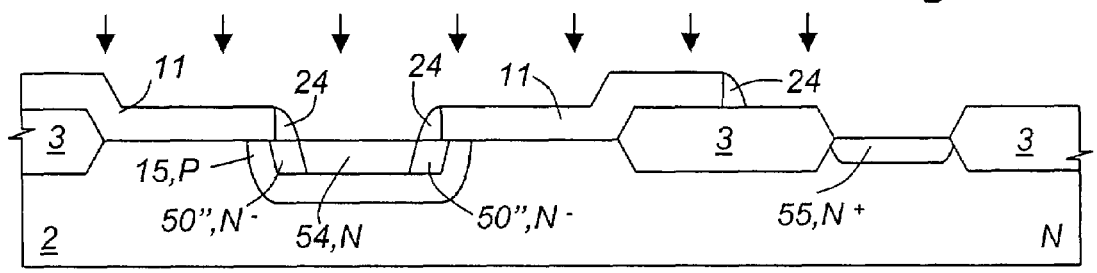

Next (FIGS. 18-20), the spacers 24 are formed, an S/D mask 52 is deposited, and the source/drain implant of N type is performed. The S/D mask 52 completely exposes the drain active areas 7 and, above the source active area 6, covers the longitudinal ends of the source active area 6. In addition, in an intermediate region of the source active area 6, the mask 52 forms islands 53, which extend width-wise (perpendicular to the longitudinal direction of the source active area 6). As may be seen in particular from FIG. 19, the islands 53 extend as far as above the two opposite sides of the gate region so that the area visible in the cross-section of FIG. 19 is not S/D implanted with N dopants, and in the area only the light LDD implant is present (transverse LDD source portion 50'). Instead, the areas upstream and downstream of each island 53, proceeding in a longitudinal direction (as illustrated in FIG. 20), are N-implanted and form source regions 54. On the sides of the source regions 54, longitudinal portions 50" are present. In practice, the source regions 54 are separate from one another in a longitudinal direction and are connected electrically at the islands 53 through the remaining LDD source regions 50'. In the drain active areas 7, drain regions 55 are formed, here of N+ type.

Figure 21:
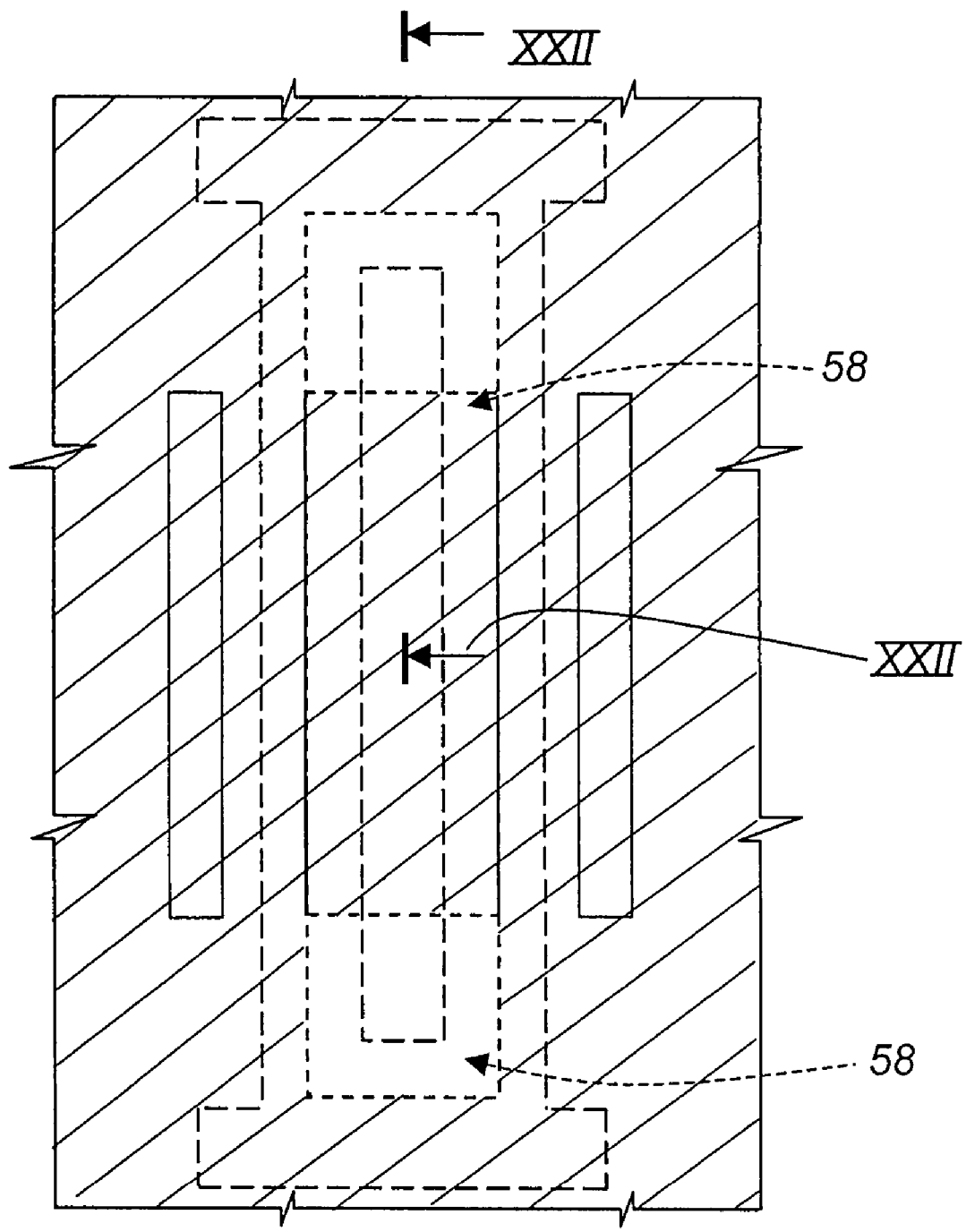
FIG. 21 illustrates a mask used in a subsequent fabrication step according to one embodiment of the present invention.

Subsequently, a first body-contact mask 58 is deposited, and exposes only the longitudinal ends of the body region 15, and a P+ implant is performed, as illustrated in FIGS. 21, 22. End contact regions 59, of P type, are then formed, as may be seen from FIG. 22, which also illustrates in part the succession of regions 50' and 54 in a longitudinal direction.

Next, FIG. 23, the wafer 1 is coated with an insulating layer 35, and the contacts are opened, analogously to the known device, thus forming openings 37a for the drain regions 26, openings 37b for the source regions 27, openings 37c for the body-contact region, and openings 37d for the gate regions 11 (of which only the openings 37a and 37c may be seen in FIG. 23).

Figure 24:
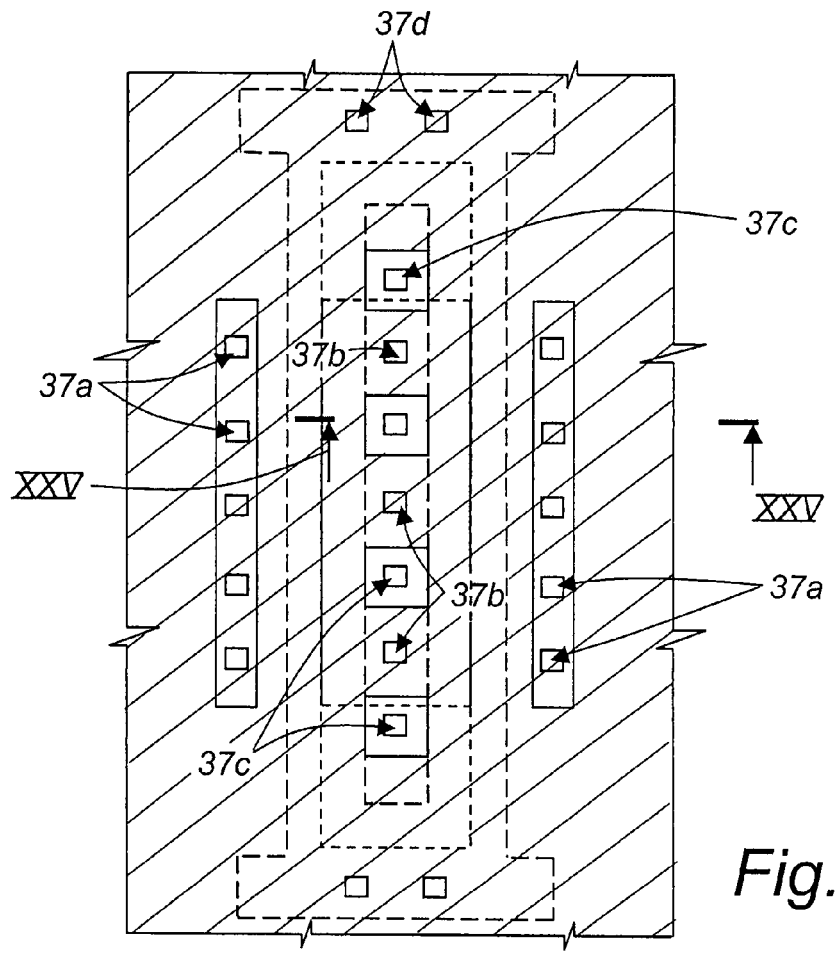
FIG. 24 illustrates a mask used in a subsequent fabrication step according to one embodiment of the present invention.
Figure 25:
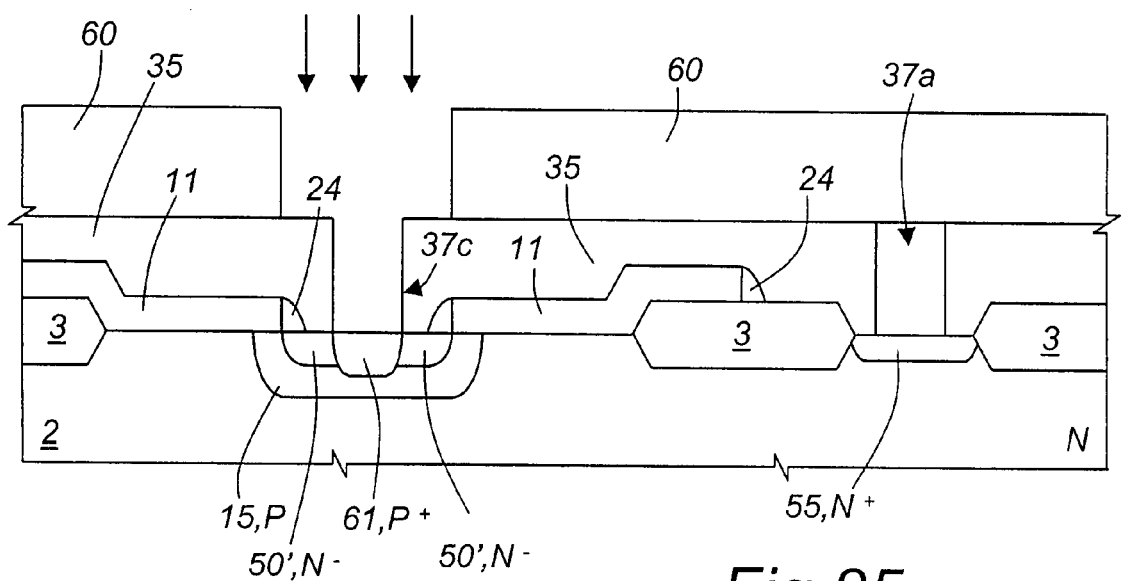
FIG. 25 illustrates a cross-section taken along section plane XXV-XXV, similar to that of FIG. 23.

Next, FIGS. 24 and 25, a second body-contact mask 60 is deposited, and an implant of P+ type is performed, referred to as open-contact implant. In one embodiment, the P+ implant includes a first, deep implantation step such as to ensure that the body region 15 is reached through the transverse portions 50', for example using $B^{11}$, with an energy of approximately 35 keV and a dose of $5*10^{13}$, and a second, superficial implantation step, for example using $BF_2$, with an energy of approximately 40 keV and a dose of $5*10^{14}$. Then body-contact regions 61 are formed.

Figure 26:
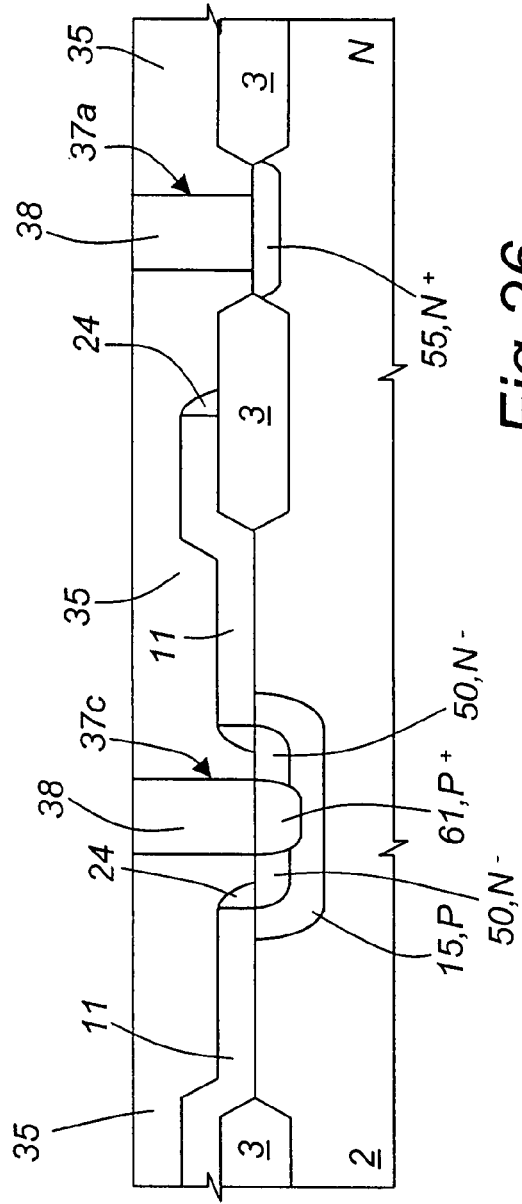
FIG. 26 illustrates a cross-section similar to FIG. 25, in a subsequent fabrication step according to one embodiment of the present invention.
Figure 27:
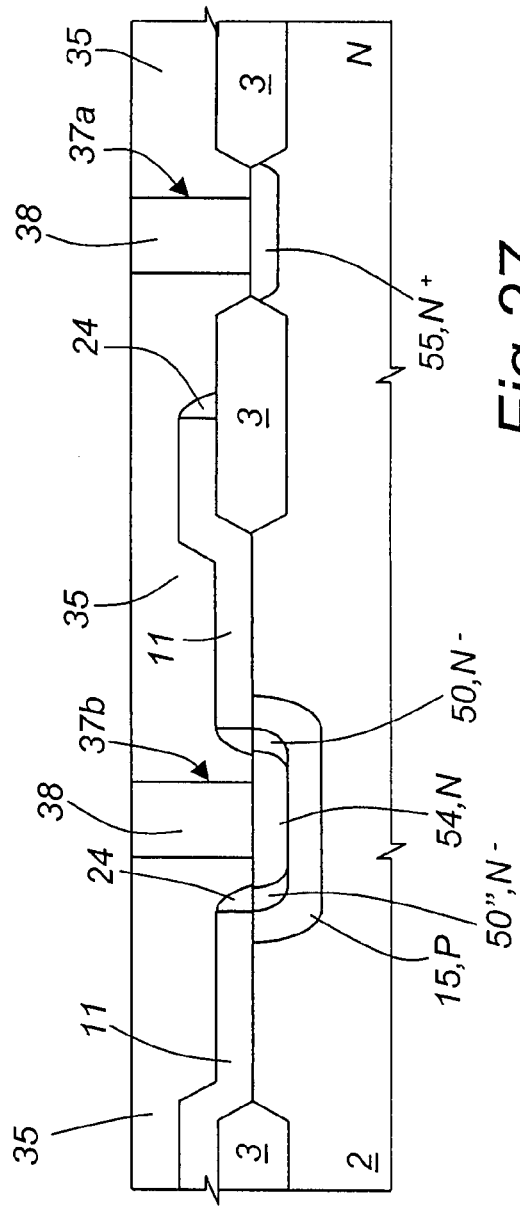
FIG. 27 illustrates a cross-section similar to FIG. 20, in a subsequent fabrication step according to one embodiment of the present invention.

Finally, the openings 37a-37d are filled with metal, so as to form the contacts 38, as illustrated in the cross-section of FIGS. 26 and 27, taken along two parallel planes.

In practice, at the end of the process, the more doped source region 54 is formed by a series of portions (here three) that are separate from one another, and the LDD source region is formed by two peripheral portions 50" and by two transverse portions 50'. The peripheral portions 50" of the LDD source region 50 (the cross section whereof may be seen in FIG. 27) extend parallel to the longitudinal direction of the active areas 6, 7 and each face a respective drain region 55. The transverse portions 50' (one of which may be seen in FIG. 26) separate physically and connect electrically the second implanted regions 54 and are interrupted centrally by the body-contact region 61.

Figure 28:
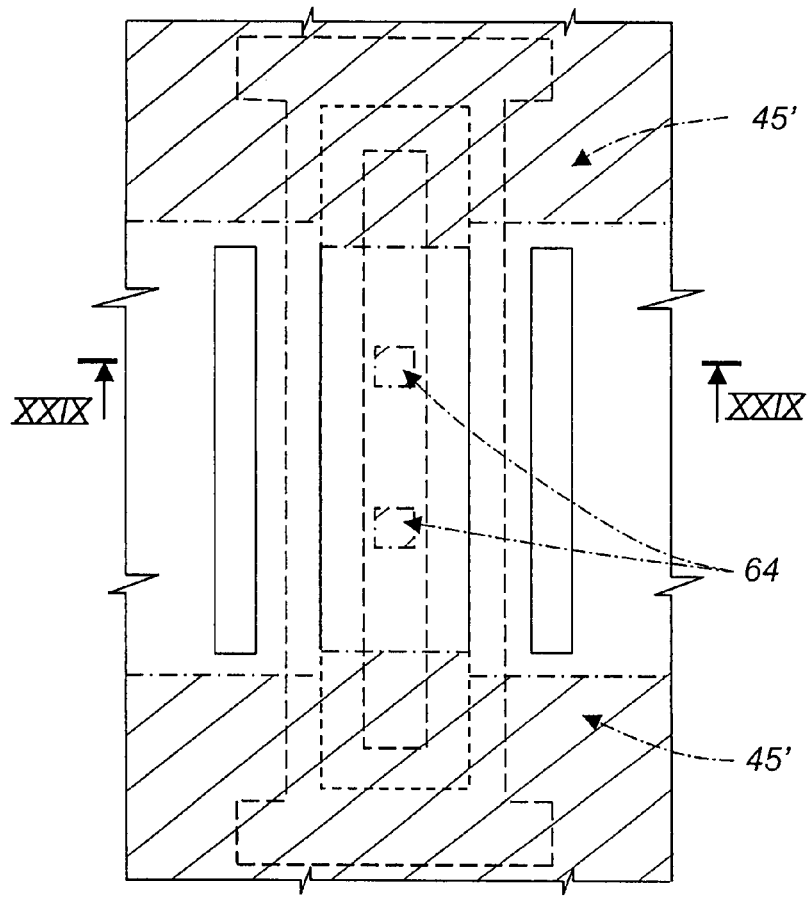
FIG. 28 illustrates a mask used in a fabrication process alternative to that of FIG. 16 according to another embodiment of the present invention.
Figure 29:
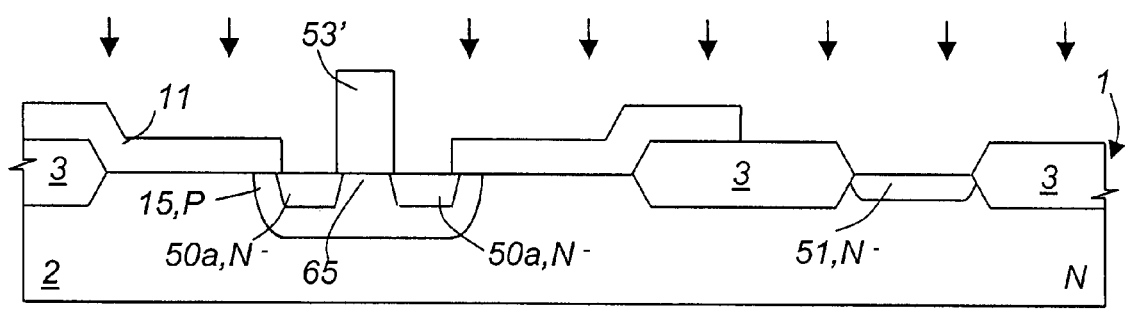
FIG. 29 illustrates a cross-section taken along section plane XXIX-XXIX.

According to a different embodiment of the process just described, the LDD implant uses a mask, which, at the source active area 6, covers the portions of the body region 15, where the body contacts 61 must be formed. In practice, as illustrated in FIG. 28, the LDD mask, designated by 45', has islands 64 that are narrower than the islands 53 of the S/D mask 52 of FIG. 18, to enable LDD implantation on all sides of the body-contact regions. In this way, as may be seen in the cross-section of FIG. 29, underneath the islands 64 non-implanted central portions 65 of P type are present, where the body region 15 emerges at the surface of the wafer 1. In this case, the next P+ implant comprises just one step, for example using $BF_2$, with an energy of approximately 40 keV and a dose of $1*10^{14}$, given that it is no longer necessary to traverse the LDD region 50".

This embodiment in practice enables just one implantation of the body-contact region 61 to be carried out, at the expense of more critical aspects linked to the LDD mask 45.

In both cases, the formation of the body-contact regions 61 with open contacts and thus self-aligned to the respective contacts 38 enables a reduction in the distances between the various regions of the device, without introducing critical aspects; in particular, it is possible to reduce to 0.4 μm the distance between the body contacts 38 and the gate region 11. By further reducing the dimensions of the contacts and the distance between the edge of the drain contacts and the corresponding drain active area, it is possible to reduce the pitch of DMOS devices, using the indicated technology, from 4.1 to 3.3 μm. In practice, a 20% reduction in the pitch and area of the DMOS is obtained.

DMOS transistor formed according to the described embodiments may be utilized in a variety of different types of electronic systems, such as computer systems.

Finally, it is evident that modifications and variations may be made to the device and fabrication process described herein, without departing from the scope of the present invention. In particular, it is emphasized that the conductivity of the various regions may be opposite to the indicated, with a well of P type, a body region of N type, and source and drain regions of P type.

From the foregoing it will be appreciated that, although specific embodiments of the invention have been described herein for purposes of illustration, various modifications may be made without deviating from the spirit and scope of the invention.

The invention claimed is:

1. A process for manufacturing a DMOS device comprising:

providing a body of semiconductor material having a surface, a first conductivity type, and a first doping level;

forming, along said surface, a field region of insulating material that separates, in said body, at least one first active area and one second active area;

forming, in said first active area, a first conductive region with said first conductivity type and with a second doping level, higher than said first doping level;

forming, in said second active area, a body region with a second conductivity type;

forming, in said body region, a second conductive region with said first conductivity type;

forming, inside said second conductive region, at least one body-contact region having said second conductivity type and extending from said surface as far as said body region;

forming, on top of said surface, an insulating layer;

forming a plurality of contact openings through said insulating layer; and forming contacts of conductive material inside said contact openings;

characterized in that said step of forming a body-contact region is performed after said step of forming a plurality of contact openings and prior to said step of forming contacts so that said body-contact region is self-aligned to a respective contact.

2. The process according to claim 1, wherein said step of forming a body-contact region comprises forming a body-contact mask, which covers said insulating layer and said contact openings except where said body-contact region is to be formed, and implanting dopant agents determining said second conductivity type.

3. The process according to claim 1, further comprising introducing dopant ionic species of said second conductivity type at longitudinal ends of said body region prior to said step of forming a plurality of openings, and wherein said step of forming a plurality of openings comprises forming further contact openings above said longitudinal ends of said body region, and said step of forming a body-contact region moreover comprises forming further body-contact regions in said longitudinal ends of said body region.

4. The process according to claim 1, wherein said step of forming a second conductive region comprises forming a first implanted region having a third doping level lower than said second doping level, and forming at least two second implanted regions, having a fourth doping level higher than said a third doping level, said step of forming a first implanted region comprising the step of forming a peripheral portion, contiguous to said first implanted regions at least on a side facing said first conductive region, and a transverse portion extending from said peripheral portion, physically separating and electrically connecting said first implanted regions and accommodating said body-contact region.

5. The process according to claim 4, comprising the steps of:
    prior to said step of forming a body region, forming a gate region extending in part on top of said second active area and in part on top of said field region and having an internal peripheral edge;
    after said step of forming a body region, implanting dopant species with said first conductivity type inside said body region, for forming a well with said first conductivity type and said third doping level;
    forming a spacing region along said internal peripheral edge of said gate region;
    selectively implanting dopant species of said first conductivity type inside said well thereby delimiting, in said well, said peripheral portion and said transverse portion, and forming said second implanted regions, said peripheral portion extending underneath said spacing region.

6. The process according to claim 5, wherein said step of forming a well comprises introducing dopant species in blanket mode inside said body region and said step of forming a body-contact region comprises implanting dopant species of said second conductivity type inside said transverse portion.

7. The process according to claim 5, wherein said step of forming a well comprises introducing dopant species inside said body region using a mask covering at least one central portion of said body region, so that said well has at least one non-implanted central portion, wherein said body region extends up to said surface and said step of forming a body-contact region comprises implanting dopant species with said second conductivity type inside said non-implanted central portion.

8. The process according to claim 1, wherein said step of forming a body-contact region comprises a superficial implanting and a deep implanting step.

9. The process according to claim 1, wherein said first conductivity type is N and said second conductivity type is P.

10. A DMOS device and the manufacturing process thereof, substantially as described herein with reference to the annexed figures.

11. A method of forming a DMOS device including a gate region, a drain region, a source body region, a body-contact region, and at least one contact, the method comprising:
    forming in the source body region a conductive region having a first conductivity type;
    forming a contact opening adjacent the source body region;
    after forming the contact opening, forming the body-contact region in the conductive region of the source body region and through the contact opening; and
    after forming the body-contact region, forming a contact adjoining the body-contact region.

12. The method of claim 11 wherein forming the body-contact region comprises implanting a dopant having a conductivity type in the source body region.

13. The method of claim 12 wherein the implanted dopant has a P+ type conductivity to form a P+ type body-contact region.

14. The method of claim 11 wherein the source body region has a second conductivity type, and wherein the body-contact region has the second conductivity type.

15. The method of claim 11, further comprising forming the source body region to be spaced from the drain region.

16. A method of forming a DMOS device, comprising:
    forming a gate region, a drain region, and a source body region spaced apart from the drain region;
    forming a conductive region in the source body region, the conductive region having a first conductivity type;
    forming a contact opening adjacent the source body region;
    after forming the contact opening, forming a body-contact region in the conductive region of the source body region and through the contact opening; and
    after forming the body-contact region, forming a contact adjoining the body-contact region.

17. The method of claim 16 wherein forming the body-contact region comprises implanting a dopant in the source body region.

18. The method of claim 17 wherein the implanted dopant has a P+ type conductivity to form a P+ type body-contact region.

19. The method of claim 16 wherein forming a gate region, a drain region, and a source body region comprises forming the drain region in a well, the drain region having the same conductivity type as the well and a higher doping level than that of the well.

20. The method of claim 16 wherein the source body region has a second conductivity type, and wherein the body-contact region has the second conductivity type.

* * * * *